US012794338B2

(12) United States Patent
Archibald

(10) Patent No.: US 12,794,338 B2
(45) Date of Patent: Nov. 10, 2026

(54) CURRENT MONITORING SCHEME FOR LOW-SIDE BODY CURRENT SENSING OF VERTICAL POWER FIELD EFFECT TRANSISTOR

(71) Applicant: Alpha and Omega Semiconductor International LP, Toronto (CA)

(72) Inventor: Nicholas I. Archibald, San Francisco, CA (US)

(73) Assignee: Alpha and Omega Semiconductor International LP, Toronto (CA)

( * ) Notice: Subject to any disclaimer, the term of this patent is extended or adjusted under 35 U.S.C. 154(b) by 1 day.

(21) Appl. No.: 19/054,722

(22) Filed: Feb. 14, 2025

(65) Prior Publication Data

US 2026/0246356 A1 Aug. 20, 2026

(51) Int. Cl.

*H02M 1/00* (2006.01)
*G01R 19/165* (2006.01)
*H03K 17/082* (2006.01)
*G01R 19/00* (2006.01)

(52) U.S. Cl.

CPC ........ *H02M 1/0009* (2021.05); *G01R 19/165* (2013.01); *G01R 19/16519* (2013.01); *H03K 17/0822* (2013.01); *G01R 19/0092* (2013.01); *H03K 2217/0027* (2013.01); *H03K 2217/0072* (2013.01); *H03K 2217/0081* (2013.01)

(58) Field of Classification Search

None
See application file for complete search history.

(56) References Cited

U.S. PATENT DOCUMENTS

| | | | | |
|---|---|---|---|---|
| 8,378,649 B2 * | 2/2013 | Moussaoui | H02M 3/1588 | 323/282 |
| 8,558,523 B2 * | 10/2013 | Qiu | H02M 3/1584 | 323/272 |
| 10,090,751 B1 * | 10/2018 | Tsyrganovich | H03K 17/687 | |
| 11,418,137 B1 * | 8/2022 | Gupta | H02P 6/28 | |
| 11,979,017 B2 * | 5/2024 | Yano | H02H 5/044 | |
| 2014/0253062 A1 * | 9/2014 | Qin | G05F 1/10 | 323/282 |
| 2014/0253089 A1 * | 9/2014 | Qin | H02M 3/158 | 323/312 |

* cited by examiner

*Primary Examiner* — Thomas J. Hiltunen

(57) ABSTRACT

A current monitoring scheme for a power FET configured as a low-side power switch in a power stage enables measuring or sensing of the body diode current flowing in the low-side power-FET when the low-side power FET is being operated in the body conduction mode. In some embodiments, the current monitoring scheme uses a smaller size sense FET for sensing the channel current as well as the body diode current flowing in the low-side power FET. A gain circuit is incorporated to adjust the gain of the sense current so that the channel current sensing and the body diode sensing are scaled to the same gain level to be provided as the monitor current output signal.

17 Claims, 7 Drawing Sheets

CURRENT MONITORING SCHEME FOR LOW-SIDE BODY CURRENT SENSING OF VERTICAL POWER FIELD EFFECT TRANSISTOR

CROSS REFERENCE TO RELATED APPLICATIONS

The present application is related to U.S. patent application Ser. No. 19/054,719, entitled BI-DIRECTIONAL CURRENT MONITORING SCHEME FOR LOW-SIDE CURRENT SENSING OF VERTICAL POWER FIELD EFFECT TRANSISTOR, filed concurrently, which is incorporated by reference in its entirety.

FIELD OF THE INVENTION

The invention relates to current monitoring for field effect transistors and, in particular, to current monitoring in a field effect transistor configured as a low-side power switch.

BACKGROUND OF THE INVENTION

Power field effect transistors (FETs) are sometimes applied in electronic systems as switches to transfer energy from a power source to a load. The power FETs, also referred to as power switches, are typically devices of large sizes to handle large current flow. For example, power FETs are used as the power stage in switching regulators in which an input supply voltage is converted to a desired output voltage at a voltage level selected for the load.

In some examples, a switching regulator may employ pulse-width modulation (PWM) control using a PWM controller or modulator to drive a power stage. In the present example, the power stage includes a pair of power FETs (or power switches), driver circuits for the power switches, and an LC filter circuit to generate the output voltage. The pair of power FETs includes a high-side power FET and a low-side power FET connected in series between the input supply voltage and the ground voltage. The LC filter circuit is connected to the common node between the high-side and low-side power FETs to filter the switching voltage signal at the common node as a result of the PWM switching of the high-side and low-side power FETs. The switch regulator includes a feedback control circuit to regulate the energy transfer to maintain a constant output voltage within the desired load limits of the circuit.

In operation, the switching regulator may be in a positive current mode where the power stage sources current (positive current) to the load. Alternately, the switching regulator may be in a negative current mode where the power stage sinks current (negative current) from the load. In some applications, negative current operation is used to improve performance of the host system, such as by performing load release (changing the load current from a high current value to a low current value) or performing negative voltage transitions (changing the output voltage from a high value to a low value by discharging the output node).

To support the operation of the switching regulator, it is often necessary to measure the current flowing through the power FETs. Current sensing or current monitoring can be performed by measuring the inductor current flowing through the inductor of the LC filter circuit, or measuring the current flowing through the low-side power FET and/or the current flowing through the high-side power FET.

SUMMARY OF THE INVENTION

The present disclosure discloses a current monitoring circuit, substantially as shown in and/or described below, for example in connection with at least one of the figures, as set forth more completely in the claims.

In one embodiment, a bi-directional current monitoring circuit is coupled to sense a current in a power field effect transistor (FET) configured as a low-side power FET in a power stage where the power stage including a high-side power FET and the low-side power FET connected in series, a common node between the high-side power FET and the low-side power FET being a switching output node. The current monitoring circuit includes: a sense field effect transistor (FET) having a drain terminal connected to a drain terminal of the low-side power FET, a gate terminal connected to the gate terminal of the low-side power FET, and a source terminal being a sense node, the sense FET conducting a current indicative of the current flowing through the low-side power FET; a positive current sense circuit coupled to the sense node to bias the sense node to a first voltage being a voltage at the source terminal of the low-side power FET, the positive current sense circuit sensing a first sense current flowing in the sense FET indicative of a positive current flowing from the low-side power FET to the switching output node; a negative current sense circuit coupled to the sense node to bias the sense node to a second voltage being greater than a drain-to-source voltage of the low-side power FET, the negative current sense circuit sensing a second sense current flowing in the sense FET indicative of a negative current flowing from the switching output node into the low-side power FET; and a sense current combining circuit coupled to receive the first sense current and the second sense current to provide a current output signal indicative of the positive and negative current flowing through the low-side power FET.

In another embodiment, a current monitoring circuit is coupled to sense a current in a power field effect transistor (FET) configured as a low-side power FET in a power stage where a drain terminal of the low-side power FET is a switching output node. The current monitoring circuit includes: a sense field effect transistor (FET) having a drain terminal connected to the drain terminal of the low-side power FET, a gate terminal connected to a gate terminal of the low-side power FET, and a source terminal being a sense node, the sense FET conducting a current indicative of the current flowing through the low-side power FET including a channel current flowing through a channel region of the low-side power FET and a body diode current flowing through a body diode of the low-side power FET; a current sense circuit coupled to the sense node to bias the sense node to a first voltage being a voltage at the source terminal of the low-side power FET, the current sense circuit sensing a first sense current flowing in the sense FET; and a gain circuit coupled to the current sense circuit to selectively adjust a gain level of the first sense current. The first sense current has a first gain level in response to sensing the channel current of the low-side power FET and the first sense current has a second gain level in response to sensing the body diode current of the low-side power FET. The gain circuit adjusts the first or second gain level of the first sense current to scale the first and second gain levels to a same gain level to provide a current output signal indicative of the channel current or the body diode current flowing through the low-side power FET.

These and other advantages, aspects and novel features of the present invention, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the figures are not necessarily to scale.

DETAILED DESCRIPTION OF THE INVENTION

According to embodiments of the present invention, a bi-directional current monitoring scheme for a field effect transistor (FET) configured as a low-side power switch in a power stage enables positive current sensing and negative current sensing using only voltages that are above the ground voltage. In some embodiments, the bi-directional current monitoring scheme measures the current flowing through a low-side power FET in a power stage using a smaller size sense FET connected substantially in parallel with the low-side power FET. Positive current sensing is carried out by biasing a sense node of the sense FET to the ground voltage while negative current sensing is carried out by biasing the sense node of the sense FET to a voltage greater than the drain-to-source voltage of the low-side power FET. The sensed positive current and sensed negative current are combined to provide a monitor current output signal.

According to another aspect of the present invention, a current monitoring scheme for a power FET configured as a low-side power switch in a power stage enables measuring or sensing of the body diode current flowing in the low-side power-FET when the low-side power FET is being operated in the body conduction mode. In some embodiments, the current monitoring scheme uses a smaller size sense FET for sensing the positive current as well as the body diode current flowing in the low-side power FET. A gain circuit is incorporated to adjust the gain of the sense current so that the positive current sensing and the body diode sensing are scaled to the same gain level to be provided as the monitor current output signal.

Figure 1:
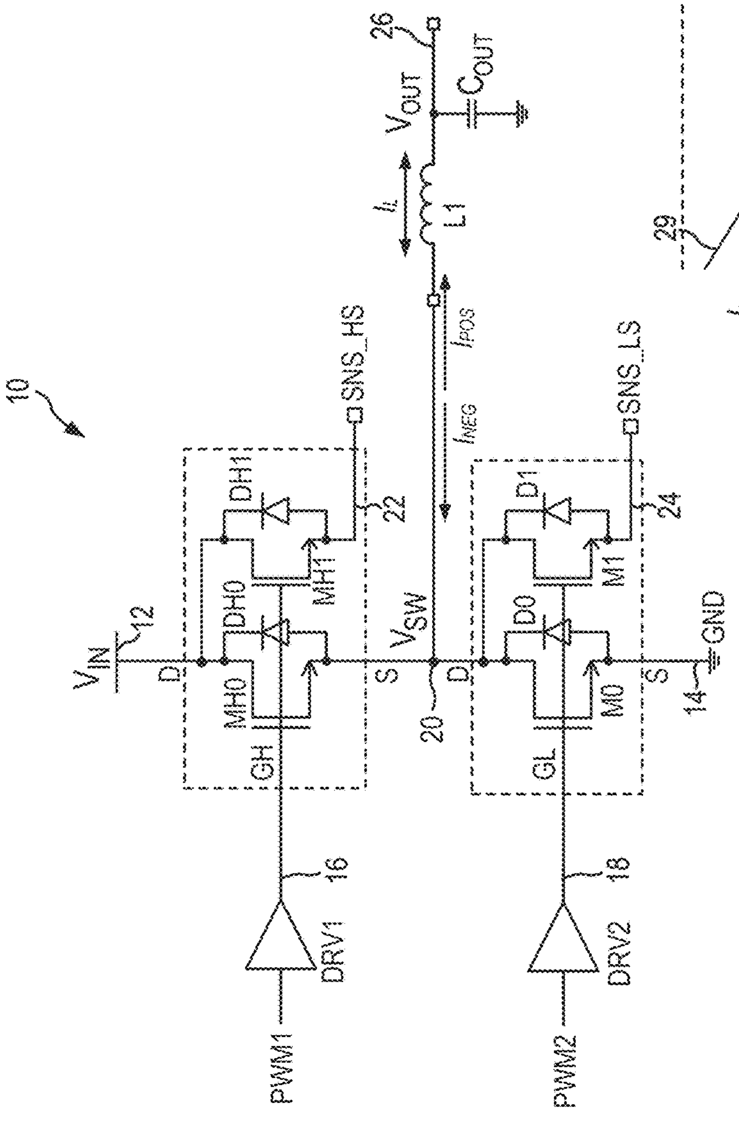
FIG. 1 is a schematic diagram of a power stage including a pair of power FETs in some examples.

FIG. 1 is a schematic diagram of a power stage including a pair of power FETs in some examples. Referring to FIG. 1, a power stage 10 includes a pair of serially connected power FETs (or power switches) MH0, M0 connected between the input voltage $V_{IN}$ (node 12) and ground (node 14). Power FETs MH0 and M0, also referred to as the high-side power FET and the low side power FET respectively, are both NMOS transistors in the present embodiment. The source terminal of the high-side power FET MH0 is connected to the drain terminal of the low-side power FET M0 which is the switching node 20 providing a switching voltage $V_{SW}$. The high-side power FET MH0 and the low-side power FET M0 are turned on and off alternately by PWM signals (e.g. PWM1 and PWM2) to generate the switching voltage $V_{SW}$. More specifically, the PWM signals PWM1 and PWM2 are coupled to respective driver circuits DRV1 and DRV2 to drive the respective power FETs MH0 and M0. The PWM signals are typically inverse of each other. In this manner, the high-side power FET MH0 and the low-side power FET M0 are turned on and off alternately by the PWM signals. As a result and ignoring the resistive drops in the power FETs, the switching voltage $V_{SW}$ switches between the input voltage $V_{IN}$ and the ground potential. The LC filter circuit is formed by an inductor L1, connected between the switching node 20 and an output node 26, and an output capacitor $C_{OUT}$, connected between the output node 26 and the ground voltage. The LC filter circuit provides current to the output node 26 while maintaining a substantially constant output voltage $V_{OUT}$.

The high-side and low-side power FETs are driven by respective gate drive signals GH (node 16) and GL (node 18) to turn on and off the power FETs. In the example where both the high-side and low-side power FETs are NMOS transistors, the high-side power FET MH0 needs to have a sufficient gate-to-source voltage to turn on. In particular, the gate drive signal GH (node 16) at the gate terminal of power FET MH0 needs to have a voltage value higher than the input voltage $V_{IN}$ in order to turn on the NMOS transistor. In some cases, the gate-to-source voltage for the high-side power FET MH0 may be boosted to provide the sufficient gate-to-source voltage.

In FIG. 1, the power FETs and the sense FETs are illustrated with their respective body diodes. For example, low-side power FET M0 has a body diode D0 and the sense FET M1 has a body diode D1. It is understood that the diodes D0, D1 and DH0 and DH1 depicted in the figures of the present description are body diodes inherent in the respective FET devices, and are not discrete diode devices.

Figure 2:
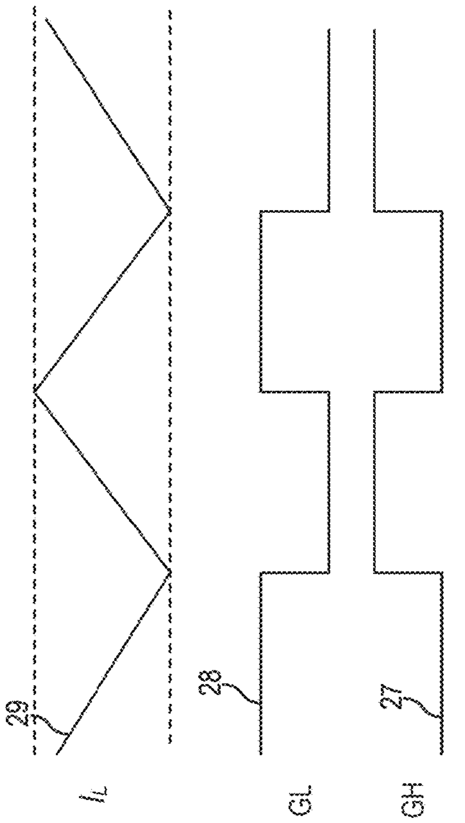
FIG. 2 illustrates the inductor current behavior in a power stage of a switching regulator in some examples.

FIG. 2 illustrates the inductor current behavior in a power stage of a switching regulator in some examples. Referring to FIG. 2, in normal operation, the gate drive signals GH (curve 27) and GL (curve 28) to the high-side and low-side power FETs are complementary. Thus, when the gate drive signal GL (curve 28) is at a logical high level, the gate drive signal GH (curve 27) is at a logical low level, and vice versa. It is instructive to note that, in actual implementation, the gate drive signals GH and GL are non-overlapping and there may be gaps between the transitions of the signals. For example, the low-to-high transition of the gate drive signal GH may occur a given duration after the high-to-low transition of the gate drive signal GL. Similarly, the low-to-high transition of the gate drive signal GL may occur a given duration after the high-to-low transition of the gate drive signal GH. The duration at which both the gate drive signals GH and GL are logical low is sometimes referred to as the non-overlapping period or dead period and is usually a very short duration during the transitions of the two gate drive signals.

Curve 29 depicts the inductor current $I_L$, or the current flowing through the switching node 20 of the power stage 10 in FIG. 1. When the low-side power switch M0 is turned on, the inductor current $I_L$ is decreasing (with a negative slope). When the high-side power switch MH0 is turned on, the inductor current $I_L$ is increasing (with a positive slope). In some cases, the inductor current may decrease below 0 A to a negative current value.

In the present description, a positive current in the power stage refers to the inductor current that flows from the power switches through the inductor L1 to the output node 26. Furthermore, in the present description, a negative current in the power stage refers to the inductor current that flows from the output node 26 (the load) through the inductor L1 to the power switches. In some applications, the switching regulator uses the negative current to discharge the current or voltage at the load. In practice, the current flowing in the high-side power switch or the low-side power switch can be a negative current. This is because the inductor current can be entirely positive, entirely negative or straddling zero current value (0 A). For instance, in an operating condition where the power switches are switching under a zero load condition, the inductor current will straddle around 0 A so that the average inductor current is 0 A. The inductor current waveform may go below 0 A during voltage transitions and after load releases.

It is often necessary to monitor the current flowing through the power FETs during operation. One conventional method for power switch current monitoring is to provide a smaller size sense FET that is connected substantially in parallel with the power FET, and therefore biased by the same voltages across power FET. The sense FET and the power FET may have a size ratio of 1:1000 or 1:10,000 and the sense FET senses a portion of the current flowing in the power FET. To enhance accuracy and eliminate variations, the sense FET is often integrated with the power FET, that is, formed on the same die as the power FET. The sense FET is biased by the same voltages across the power FET so that the current flowing through the sense FET is close to the current flowing through the power FET, factored by the size ratio. In most cases, the power FET is constructed using a vertical trench FET structure where the substrate forms a backside drain terminal of the power FET. The integrated sense FET therefore share the backside drain terminal with the power FET with the substrate being the common drain node. That is, for a vertical trench FET structure, the sense FET and the power FET will necessarily have their drain terminals connected together.

Other methods to monitor the current in the power FET include measuring the drain-to-source voltage Vds across the power FET and estimating the drain-to-source resistance (Rds_On) to then estimate the current value.

Referring again to FIG. 1, in the present example, a sense FET M1 is provided for low-side power FET M0 and a sense FET MH1 is provided for the high-side power FET MH0. In the present example, the power FETs are vertical trench FETs and therefore the drain terminal of the sense FET M1 is connected to the drain terminal of the low-side power FET M0, and similarly for sense FET MH1 and high-side power FET MH0. The sense FET M1 is driven by the same gate drive signal GL as the low-side power FET M0. Accordingly, the sense FET M1 is biased by the same voltages as the low-side power FET M0 for sensing a portion of the current flowing in the power FET M0. As long as the sense node SNS_LS (node 24) is biased to the same voltage as the source of low-side power FET M0, the sense node SNS_LS (node 24) provides the low-side sense current. At the high-side, the sense FET MH1 is driven by the same gate drive signal GH as the high-side power FET MH0. Accordingly, the sense FET MH1 is biased by the same voltages as the high-side power FET MH0 for sensing a portion of the current flowing in the power FET MH0. As long as the sense node SNS_HS (node 22) is biased to the same voltage as the source of high-side power FET MH0, the sense node SNS_HS (node 22) provides the high-side sense current.

With the sense FETs thus provided, the inductor current, or the current flowing through the power FETs can be sensed or measured. The present invention concerns current monitoring at the low-side power FET of the power stage. Therefore, in the following description, only current monitoring in the low-side power FET is described. It is understood that current monitoring in the high-side power FET can be implemented using conventional techniques known to those skilled in the arts.

As thus configured, the low-side sense FET M1 is used to sense the positive and negative current flowing through the low-side power FET M0. During positive current conduction, the source of the low-side power FET (node 14) is at the ground voltage (0V) while the drain (node 20) is at a negative voltage (below 0V). Accordingly, by biasing the sense FET M1's source terminal (the sense node SNS_LS) to 0V, the sense FET M1 can sense a ratioed or scaled version of the positive current flowing in the low-side power FET M0. For example, the sense node SNS_LS may be coupled to a positive supply voltage (e.g. a 5V power rail) and a sense current flows in the sense FET M1 being proportional to the positive current flowing in the low-side power FET M0. The sense current can be amplified up or down to use as the monitor current output signal.

On the other hand, sensing or measuring negative current in the low-side power FET is more challenging. During negative current conduction, the drain (node 20) of the low-side power FET goes above the ground voltage, i.e. a positive voltage. Conventional current monitoring scheme regulates the sense node SNS_LS to 0V which would result in negative voltage biasing in order to source the sense current through the sense FET. In some examples, a charge pump is used to generate the negative voltage for the sensing circuitry so that the sense current can be pulled from the 0V sense node. But charge pump circuitry is undesirable as it is usually a large circuit with large power consumption. Other convention techniques include using $V_{DS}$ voltage sensing or using an offset voltage for negative current conduction. These other conventional techniques generally provide less accuracy in the current sensing as the sense current is estimated and not measured as a scaled portion of the actual current.

In embodiments of the present invention, a bi-directional current monitoring scheme for a field effect transistor (FET) configured as a low-side power switch in a power stage enables positive current sensing and negative current sensing using voltages that are above the ground voltage. In particular, the current monitoring scheme of the present invention enables negative current sensing without the use of charge pump or other less accurate sensing techniques. Moreover, the current monitoring scheme of the present invention enables individual temperature compensation of the sense current measurements for positive current conduction and negative current conduction to further enhance the sense current accuracy.

Figure 3:
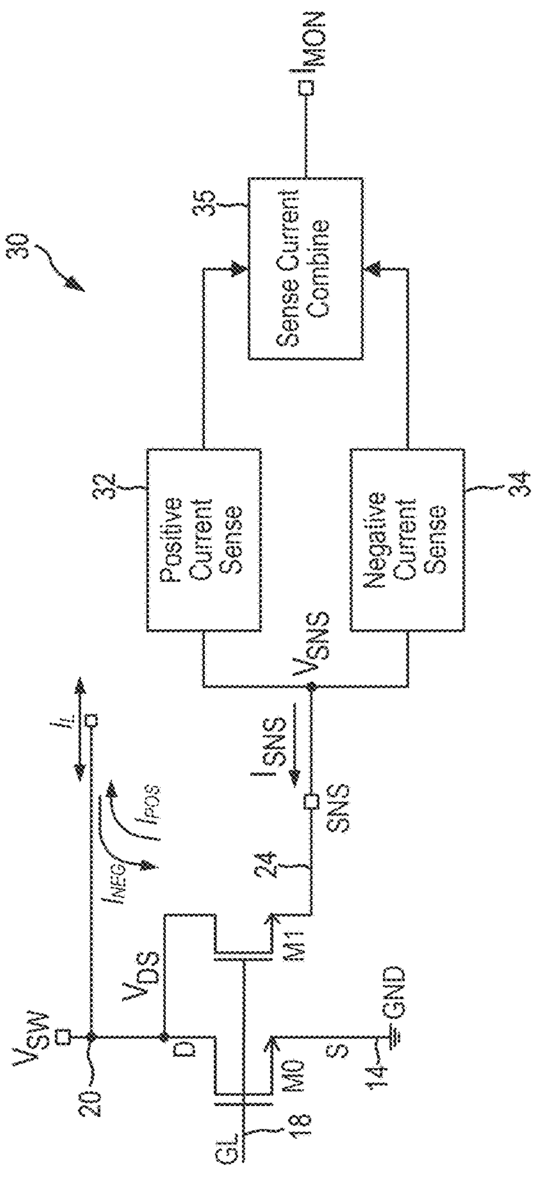
FIG. 3 is a schematic diagram of a current monitoring circuit coupled to a low-side power FET to implement bi-directional current sensing in embodiments of the present invention.

FIG. 3 is a schematic diagram of a current monitoring circuit coupled to a low-side power FET to implement bi-directional current sensing in embodiments of the present invention. Referring to FIG. 3, a current monitoring circuit 30 including a sense FET M1 is coupled to sense the current flowing in a low-side power FET M0. In some examples, the low-side power FET M0 is part of a power stage including a high-side power switch and the low-side power FET M0 as the low-side power switch. In the present illustration, the high-side power switch is omitted for simplicity. The common node 20 between the high-side power switch and the low-side power switch M0 is the switching node 20 which is to be coupled to the inductor of the LC filter circuit providing an output voltage to an output node, as shown in FIG. 1. The LC filter circuit is also omitted in the present illustration for simplicity.

The current monitoring circuit 30 is configured to sense both the positive current $I_{POS}$ and the negative current $I_{NEG}$ flowing between the inductor and the low-side power FET M0. As described above, the positive current $I_{POS}$ refers to a current flowing from the low-side power FET M0 to the inductor and the negative current $I_{NEG}$ refers to a current flowing from the inductor to the low-side power FET M0. The positive and negative currents are sometimes referred to collectively as the inductor current $I_L$. In embodiments of the present invention, the current monitoring circuit 30 splits the current sensing for the positive and negative current flows and senses each current separately in the same sense FET M1. The sensed current for the positive and negative current flows are subsequently combined to provide the monitor current output signal $I_{MON}$.

In some embodiments, the current monitoring circuit 30 includes a positive current sense circuit 32 and a negative current sense circuit 34, both coupled to bias or regulate the voltage $V_{SNS}$ at the sense node SNS. As a result of the respective bias voltage, a sense current $I_{SNS}$ flows in the sense node SNS. The current monitoring circuit 30 includes a sense current combine circuit 35 which operates to buffer the sense current from either the positive or negative current sense circuit and to combine the measured sense currents to yield the monitor current output signal $I_{MON}$.

Figure 4:
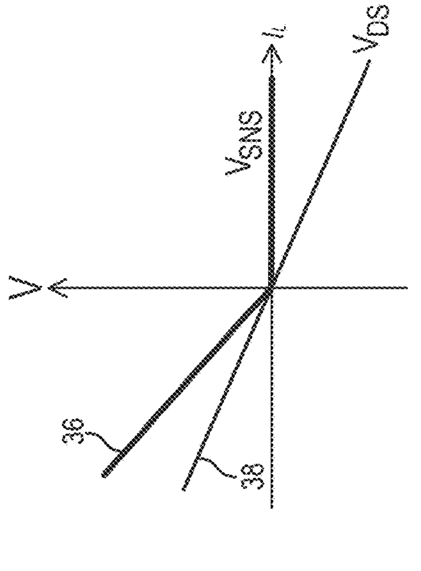
FIG. 4 is a plot illustrating the relationship between the sense node voltage and the inductor current in some embodiments.
Figure 5:
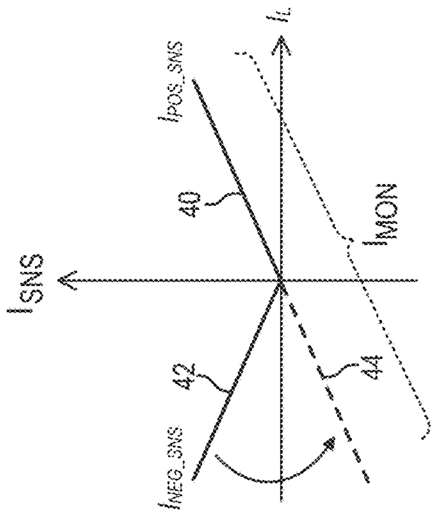
FIG. 5 is a plot illustrating the relationship between the sense current and the inductor current in some embodiments.

The operation of the current monitoring circuit 30 will be described with reference to FIGS. 4 and 5. FIG. 4 is a plot illustrating the relationship between the sense node voltage and the inductor current in some embodiments. FIG. 5 is a plot illustrating the relationship between the sense current and the inductor current in some embodiments. In FIG. 4, the curve 36 illustrates the sense voltage $V_{SNS}$ and the curve 38 illustrates the drain-to-source voltage $V_{DS}$ of the low-side power FET as a function of the inductor current $I_L$. In FIG. 5, curve 40 illustrates the sense current $I_{POS\_SNS}$ for the positive current sensing and curve portion 42 illustrates the sense current $I_{NEG\_SNS}$ for the negative current sensing. Curve 44 illustrates the modification of the sense current $I_{NEG\_SNS}$ to generate the monitor current output signal $I_{MON}$.

Referring to FIGS. 3, 4 and 5, according to embodiments of the present invention, the current monitoring circuit 30 regulates the sense node SNS to different voltage values for positive current sensing versus negative current sensing. In the case the inductor current $I_L$ is a positive current (the right quadrants of the plot) and the drain-to-source voltage $V_{DS}$ has a negative voltage value, the positive current sense circuit 32 is engaged to bias the sense node SNS to the ground voltage or 0V. On the other hand, in the case the inductor current $I_L$ is a negative current (the left quadrants of the plot) and the drain-to-source voltage $V_{DS}$ has a positive voltage value, the negative current sense circuit 34 is engaged to bias the sense node SNS to a positive voltage greater than the drain-to-source voltage $V_{DS}$ across the low-side power FET. Accordingly, the sense node SNS is regulated to different voltage values for positive current sensing and negative current sensing.

As shown in FIG. 4, for positive current sensing, the sense node SNS is regulated to the ground voltage (0V). For negative current sensing, the sense node SNS is regulated to a positive voltage greater than the drain-to-source voltage $V_{DS}$ of the low-side power FET. In some embodiments, for negative current sensing, the sense node SNS is biased to a voltage that is N times the drain-to-source voltage $V_{DS}$ across the low-side power FET, N being a number greater than 1. In one embodiment, for negative current sensing, the sense node SNS is biased to a voltage that is two times (2×) the drain-to-source voltage $V_{DS}$ across the low-side power FET. For example, curve 36 denotes voltage values that are two times the voltage values of curve 38.

During negative current conduction, by applying a sense voltage $V_{SNS}$ that is greater than the drain-to-source voltage $V_{DS}$ across the low-side power FET, the current monitoring circuit 30 essentially reverses the direction of the current flowing through the sense FET so that the sense FET can source the sense current from sense circuitry that is biased at voltages above ground voltage. As a result, the sense current $I_{SNS}$ as measured has only positive current components, as shown in FIG. 5. Referring to FIG. 5, as a result of the split sense node voltage bias, the sense current $I_{SNS}$ as measured includes a first portion $I_{POS\_SNS}$ depicting the positive sense current (curve 40) and a second portion $I_{NEG\_SNS}$ depicting the negative sense current (curve 42). For positive inductor current, the sense current $I_{POS\_SNS}$ has positive current values (curve 40). For negative inductor current, the sense current $I_{NEG\_SNS}$ also has positive current values (curve 42).

In embodiments of the present invention, the current monitoring circuit 30 includes a sense current combine circuit 35 for combining the positive sense current $I_{POS\_SNS}$ and the negative sense current $I_{NEG\_SNS}$ and to generate the monitor current output signal $I_{MON}$. In some embodiments, the sense current combine circuit operates to wrap around or modify the polarity of the negative sense current $I_{NEG\_SNS}$ to negative current values (curve 44). Accordingly, the monitor current output signal $I_{MON}$ has the desired current value polarities for positive current sensing and negative current sensing. As thus configured, the current monitoring circuit 30 of the present invention provides accurate current sensing of a low-side power FET without the use of power-hungry charge pump and without any offset cancellation errors.

Figure 6:
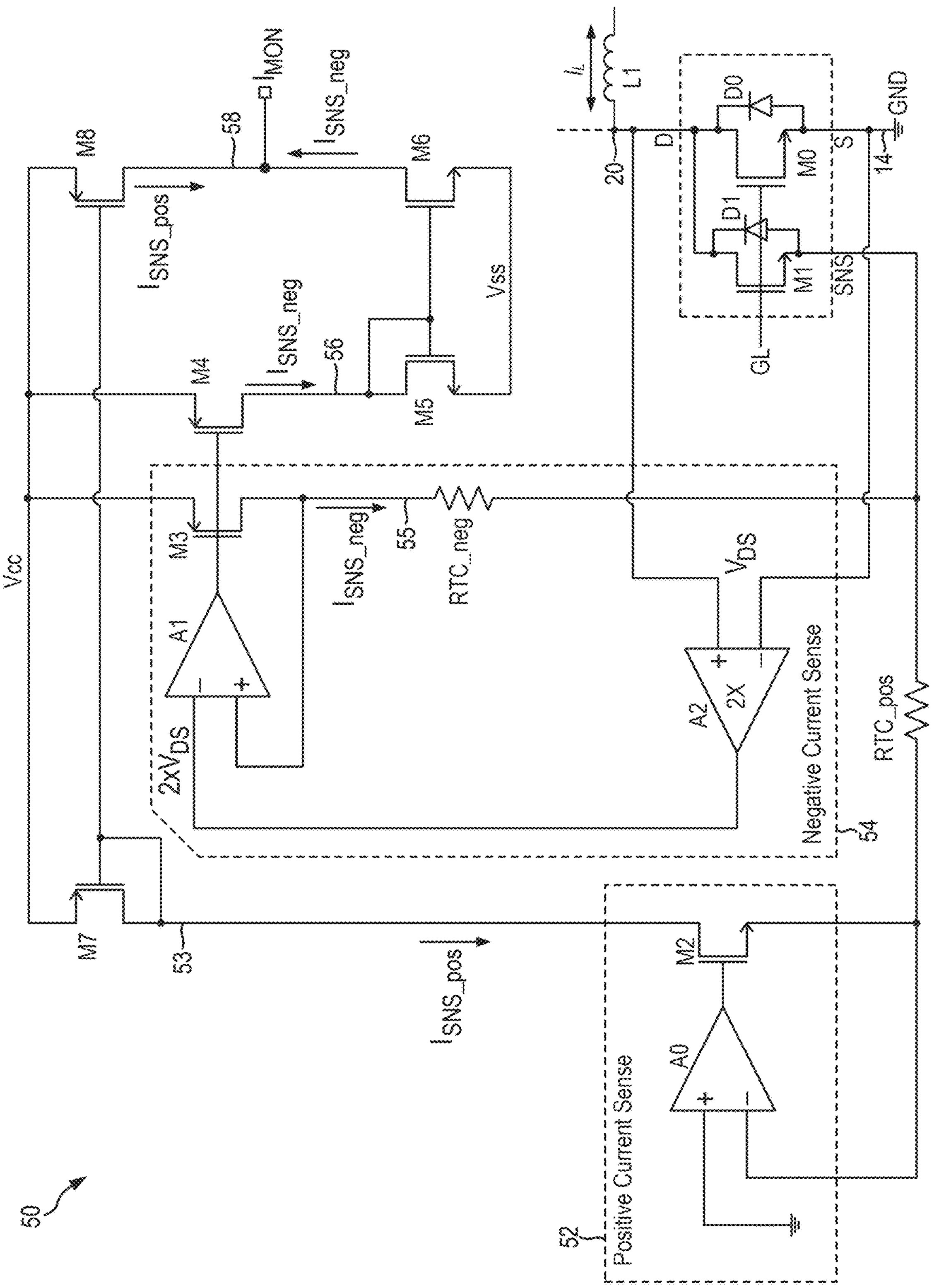
FIG. 6 is a circuit diagram of a current monitoring circuit coupled to a low-side power FET to implement bi-directional current sensing in embodiments of the present invention.

FIG. 6 is a circuit diagram of a current monitoring circuit coupled to a low-side power FET to implement bi-directional current sensing in embodiments of the present invention. FIG. 6 illustrates a current monitoring circuit 50 which can be used to implement the current monitoring circuit of FIG. 3 in some embodiments. Referring to FIG. 6, the current monitoring circuit 50 includes a sense FET M1 coupled to sense a current flowing in a low-side power FET M0. Similar to FIG. 3, the low-side power FET M0 is part of a power stage including a high-side power switch and the low-side power FET M0 as the low-side power switch. In the present illustration, the high-side power switch is omitted for simplicity. The common node 20 between the high-side power switch and the low-side power switch M0 is the switching node 20 which is to be coupled to the inductor of the LC filter circuit providing an output voltage to an output node, as shown in FIG. 1. The LC filter circuit is also omitted in the present illustration for simplicity.

The current monitoring circuit 50 includes a positive current sense circuit 52 and a negative current sense circuit 54. The positive current sense circuit 52 includes an amplifier A0 and a FET M2 configured in a negative feedback loop, with the gate terminal of FET M2 being driven by the output signal of amplifier A0. In the present embodiment, FET M2 is an NMOS transistor. Amplifier A0 receives a ground voltage or 0V at the positive input terminal as the reference voltage. The source terminal of FET M2 and the negative input terminal of amplifier A0 are connected together and connected to the sense node SNS, through an optional resistor RTC_pos. As thus configured, the sense node SNS is regulated to the reference voltage of 0V by the feedback loop of amplifier A0 and FET M2. The current flowing in FET M2 is the positive sense current $I_{SNS\_pos}$. In the present embodiment, a current mirror is coupled to the drain terminal (node 53) of the FET M2 to mirror the positive sense current $I_{SNS\_pos}$. In particular, the current mirror is formed by a diode-connected FET M7 and a FET M8. In the present example, both FETs M7 and M8 are PMOS transistors and have source terminals connected to a positive power supply voltage, such as the Vcc voltage. The diode-connected FET M7 has a drain terminal coupled to the drain terminal of FET M2 to mirror the current $I_{SNS\_pos}$ to the drain terminal of FET M8. The mirrored current is provided to the output node 58 as the monitor current output signal $I_{MON}$. In particular, the monitor current output signal $I_{MON}$ has a positive current value when the current through the low-side power FET is a positive current.

The negative current sense circuit 54 includes an amplifier A2, an amplifier A1 and a FET M3. Amplifier A2 senses the drain-to-source voltage $V_{DS}$ across the low-side power FET M0 at the input terminals of the amplifier and applies a gain factor to voltage $V_{DS}$. In the present embodiment, amplifier A2 applies a two times gain factor to the input voltage so that amplifier A2 provides an output voltage that is $2\times V_{DS}$. The $2\times V_{DS}$ output voltage of amplifier A2 is provided to the negative input terminal of amplifier A1 as the reference voltage. In one example, the voltage $V_{DS}$ is 50 mV in operation and amplifier A2 output voltage is therefore 100 mV and the 100 mV is provided to amplifier A1 as the reference voltage. The amplifier A1 and the FET M3 configured in a negative feedback loop, with the gate terminal of FET M3 being driven by the output signal of amplifier A1. In the present embodiment, FET M3 is a PMOS transistor and has a source terminal connected to the positive power supply voltage Vcc. The drain terminal of FET M3 and the positive input terminal of amplifier A1 are connected together and connected to the sense node SNS, through an optional resistor RTC_neg. As thus configured, the sense node SNS is regulated to the reference voltage or $2\times V_{DS}$ by the feedback loop of amplifier A1 and FET M3. The current flowing in FET M3 is the negative sense current $I_{SNS\_neg}$ (node 55). In the present embodiment, the negative sense current $I_{SNS\_neg}$ is first copied to a FET M4. FET M4 is also a PMOS transistor and has source terminal connected to the positive power supply voltage Vcc and a gate terminal connected to the gate terminal of FET M3. Therefore, the drain terminal (node 56) of FET M4 conducts a current being a copy of the negative sense current $I_{SNS\_neg}$.

A current mirror is coupled to the drain terminal (node 56) of the FET M4 to mirror the negative sense current $I_{SNS\_neg}$ as well as to modify the negative sense current $I_{SNS\_neg}$ to the desired polarity for proper reporting of the negative current values. The negative sense current $I_{SNS\_neg}$ has positive current values. The current mirror coupled to FET M4 is formed by a diode-connected FET M5 and a FET M6. In the present example, both FETs M5 and M6 are NMOS transistors and have source terminals connected to the ground voltage or 0V. The diode-connected FET M5 has a drain terminal coupled to the drain terminal of FET M4 to mirror the current $I_{SNS\_neg}$ to the drain terminal of FET M6. The mirrored current is wrapped around so that the mirrored current now has negative current values. The mirrored current is provided to the output node 58 as the monitor current output signal $I_{MON}$. In particular, the monitor current output signal $I_{MON}$ has a negative current value when the current through the low-side power FET is a negative current.

In current monitoring circuit 50, the current mirror of FETs M7 and M8 and the current mirror of FETs M5 and M6 form the sense current combine circuit for combining the positive sense current $I_{SNS\_pos}$ and the negative sense current $I_{SNS\_neg}$ and modifying the negative sense current to provide the monitor current output signal $I_{MON}$ having the desired current polarities. Furthermore, with separate current mirroring circuits, the gains of the positive sense current $I_{SNS\_pos}$ and the negative sense current $I_{SNS\_neg}$ can be independently set through their respective current mirrors. In this manner, the positive and negative sense currents are individually adjusted before being combined into the monitor current output signal $I_{MON}$ to realize greater sensing accuracy. In particular, different gain values for the positive sense current and the negative sense current are sometimes needed because of differences in the ratios of sense current to power FET current between the positive current regime and the negative current regime. The differences in current ratios are result of the parasitic resistances in the power FET and the sense FET transistor structure. For instance, in the positive current regime, the parasitic resistances are mostly matched between the power FET and the sense FET. However, in the negative current regime, the parasitic resistances are not well matched between the power FET and the sense FET. Accordingly, the ratio of FETs M7 and M8 can be selected to set a gain level for the positive sense current $I_{SNS\_pos}$ and the ratio of FETs M5 and M6 can be selected to set a gain level for the negative sense current $I_{SNS\_neg}$ to realize greater level of sensing accuracy.

For example, the positive current sense circuit may have a gain of IL/1000 and the negative current sense circuit may have a gain of IL/700. In that case, FET M8 may have a gain of 1 while FET M6 may have a gain of 7/10 so that the monitor current output signal $I_{MON}$ is balanced for the positive and negative current sensing.

In embodiments of the present invention, resistors RTC_pos and RTC_neg are incorporated to implement temperature compensation of the positive and negative sense currents. In particular, the ratio of the currents between the low-side power FET and the sense FET in vertical power FET designs does not perfectly track as temperature changes. This is due to the fact that not all component parts of the on-resistance Rds_On (e.g. the channel resistance, the substrate resistance, the metal resistance) scale in the same magnitude. Accordingly, correction to the sense currents is applied to compensate for inaccuracies due to temperature variations. In embodiments of the present invention, the resistor RTC_pos is connected to the sense node SNS and to the source terminal of FET M2 of the positive current sense circuit to linearize the positive sense current over temperature variations. Meanwhile, the resistor RTC_neg is connected to the sense node SNS and to the drain terminal of FET M3 of the negative current sense circuit to linearize the negative sense current over temperature variations. The resistors RTC_pos and RTC_neg are optional and may be omitted in other embodiments of the present invention.

In some embodiments, the amplifiers A0 and A1 are low offset high bandwidth amplifiers. The current monitoring circuit 50 uses amplifier A0 and A1 to drive the sense node SNS to the respective voltage value for sensing either a positive current or a negative current flowing in the low-side power FET. The sense current is the current needed to drive the sense node SNS to the desired voltage. Each of the positive and negative sense currents is independently gain-adjusted and then mirrored to provide the monitor current output signal being an accurately scaled version of the current flowing in the low-side power FET. Optional temperature linearization resistors can be added to compensate for the shift in the current sense ratio between the low-side power FET and the sense FET over temperature.

Figure 7:
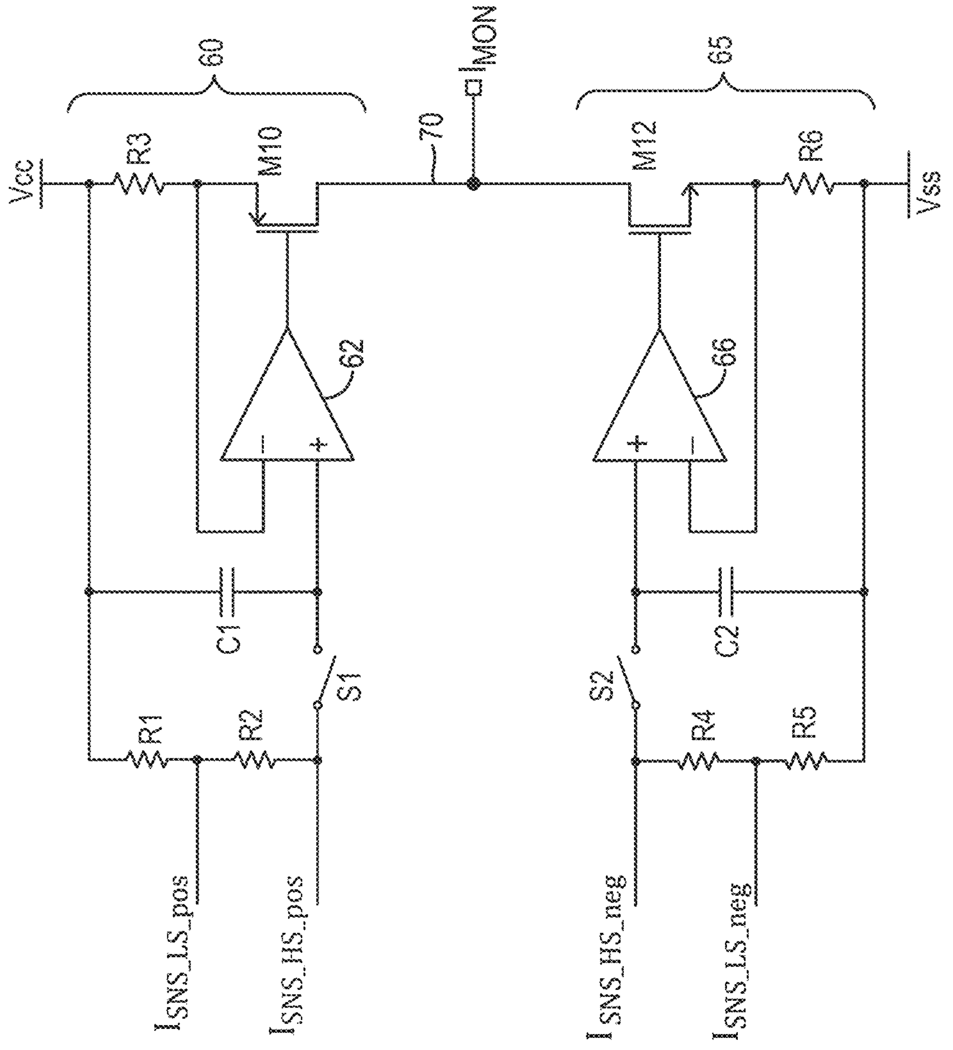
FIG. 7 is a circuit diagram of active current mirror circuit implementation which can be applied to the current monitoring circuit of FIG. 6 in some embodiments.

In the embodiment shown in FIG. 6, the current monitoring circuit is implemented using passive current mirrors to buffer and copy the positive and negative sense current to generate the monitor current output signal. In other embodiments of the present invention, the current monitoring circuit incorporate active current mirror circuits. FIG. 7 is a circuit diagram of active current mirror circuit implementation which can be applied to the current monitoring circuit of FIG. 6 in some embodiments. In particular, the active current mirror circuits of FIG. 7 can be incorporated in the current monitoring circuit 50 to replace the passive current mirrors of FETs M7/M8 and FETs M5 and M6. Active current mirrors have the advantage of providing accuracy over a wide range of current values.

Referring to FIG. 7, an active current mirror circuit 60 is provided for buffering and mirroring the positive sense current and an active current mirror circuit 65 is provided for buffering and mirroring the negative sense current. Each active current mirror circuit 60, 65 is implemented using an amplifier and a FET configured in a negative feedback loop. In particular, for the active current mirror circuit 60 for the positive sense current, an amplifier 62 is coupled to drive a PMOS transistor M10, where amplifier 62 and PMOS transistor M10 are configured in a negative feedback loop. The source terminal of PMOS transistor M10 is connected to the positive power supply voltage through a resistor R3. For the active current mirror circuit 65 for the negative sense current, amplifier 66 is coupled to drive a NMOS transistor M12, where amplifier 66 and NMOS transistor M12 are configured in a negative feedback loop. The source terminal of NMOS transistor M12 is connected to the ground voltage through a resistor R5.

In the present embodiment, the positive sense current sensed from the low-side power FET $I_{SNS\_LS\_pos}$ is coupled through a resistor divider R1/R2 and a switch S1 to the positive input terminal of amplifier 62. In the present embodiment, the positive sense current sensed from the high-side power FET $I_{SNS\_HS\_pos}$ is also coupled to the resistor divider R1/R2. The resistor divider R1/R2 have resistance values selected to provide the desired gain scaling of the positive sense currents from the high-side power FET and the low-side power FET. In the present embodiment, the switch S1 and the capacitor C1 in the active current mirror circuit 60 implements a switched capacitor circuit which is used for blanking of the sense current reporting, such as during the transition periods of the power FETs. The operation of the switched capacitor circuit will be described in more details below.

In the present embodiment, the negative sense current sensed from the low-side power FET $I_{SNS\_LS\_neg}$ is coupled through a resistor divider R4/R5 and a switch S2 to the positive input terminal of amplifier 66. In the present embodiment, the negative sense current sensed from the high-side power FET $I_{SNS\_HS\_neg}$ is also coupled to the resistor divider R4/R5. The resistor divider R4/R5 have resistance values selected to provide the desired gain scaling of the negative sense currents from the high-side power FET and the low-side power FET. In the present embodiment, the switch S2 and the capacitor C2 in the active current mirror circuit 65 implements a switched capacitor circuit which is used for blanking of the sense current reporting, as will be described in more details below.

Figure 8:
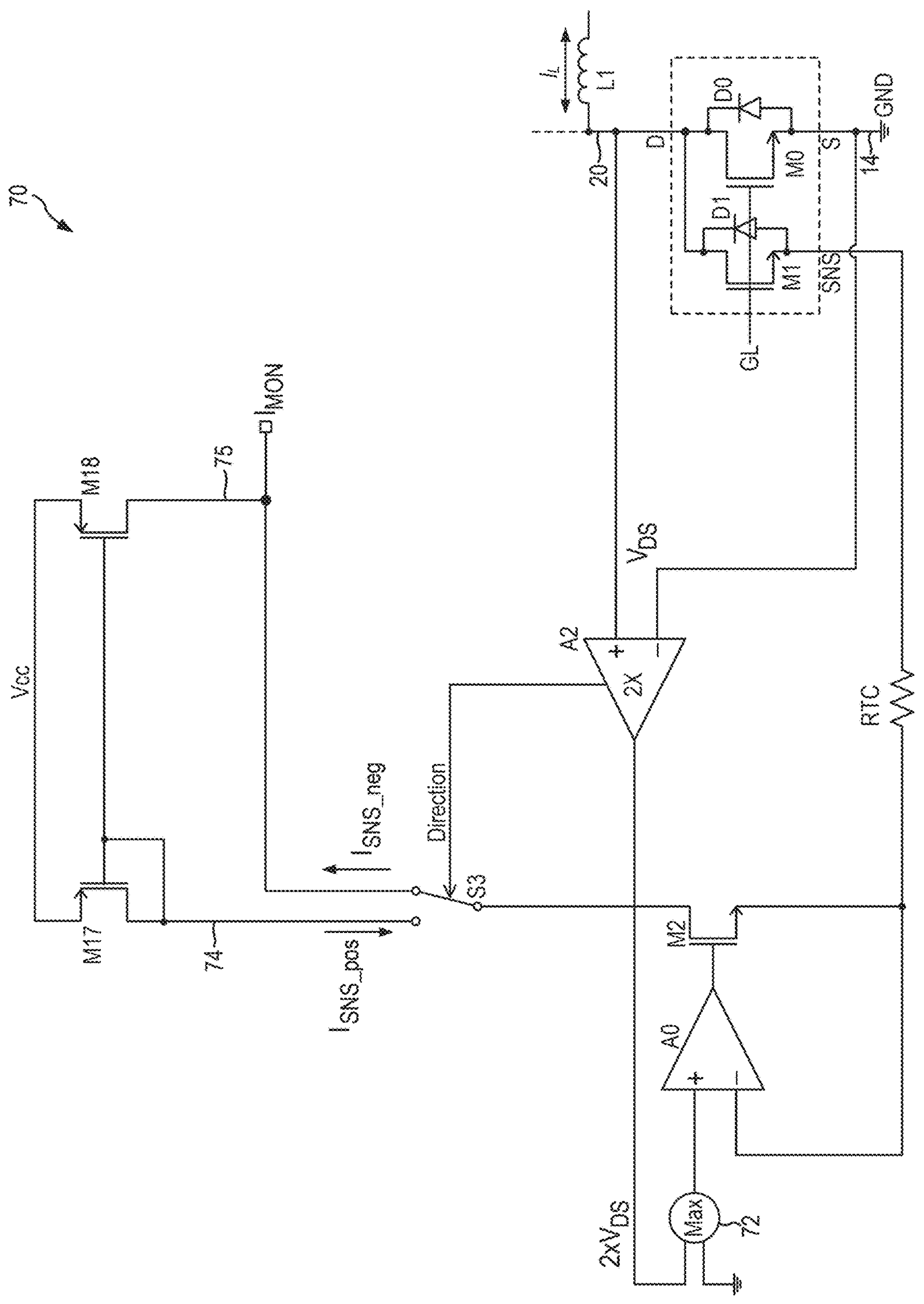
FIG. 8 is a circuit diagram of a current monitoring circuit coupled to a low-side power FET to implement bi-directional current sensing in an alternate embodiment of the present invention.

FIG. 8 is a circuit diagram of a current monitoring circuit coupled to a low-side power FET to implement bi-directional current sensing in an alternate embodiment of the present invention. In particular, FIG. 8 illustrates a simplified implementation of the current monitoring circuit 50 of FIG. 6. Referring to FIG. 8, a current monitoring circuit 70 includes an amplifier A2 which senses the drain-to-source voltage $V_{DS}$ across the low-side power FET M0 at the input terminals of the amplifier and applies a gain factor to voltage $V_{DS}$. In the present embodiment, amplifier A2 applies a two times gain factor to the input voltage so that amplifier A2 provides an output voltage that is $2\times V_{DS}$. The current monitoring circuit 70 further includes an amplifier A0 and a FET M2 configured in a negative feedback loop, with the gate terminal of FET M2 being driven by the output signal of amplifier A0. In the present embodiment, FET M2 is an NMOS transistor. Amplifier A0 receives at its positive input terminal a reference voltage provided by a max selector 72. The max selector 72 receives a ground voltage (0V) and the $2\times V_{DS}$ output voltage of amplifier A2 and selects the greater of the two voltages as the reference voltage for amplifier A0. During positive current conduction, the drain voltage has a negative voltage value, therefore the max selector 72 will select the ground voltage (0V) as the reference voltage. The feedback loop of amplifier A0 and FET M2 will bias the sense node SNS to the ground voltage (0V). During negative current conduction, the drain voltage has a positive voltage value, therefore the max selector 72 will select the $2\times V_{DS}$ voltage as the reference voltage. The feedback loop of amplifier A0 and FET M2 will bias the sense node SNS to the $2\times V_{DS}$ voltage. In this manner, the sense node SNS is biased accordingly for either positive current sensing or negative current sensing. In the present embodiment, a resistor RTC is coupled between the source terminal of FET M2 and the sense node SNS to linearize the sense current over temperature variations.

The current monitoring circuit 70 includes a switch S3 which has first and second switch positions selected by the direction of the current flowing in the low-side power FET. For example, switch S3 may be controlled by a signal from amplifier A2 indicating whether the drain-to-source voltage $V_{DS}$ sensed by the amplifier has a positive or negative voltage value. In response to the drain-to-source voltage $V_{DS}$ being a negative voltage, the switch S3 connects to the first switch position (node 74) and the positive sense current $I_{SNS\_pos}$ is coupled to the current mirror formed by PMOS transistors M17 and M18. The mirrored current is provided to the output node 75 as the monitor current output signal. In response to the drain-to-source voltage $V_{DS}$ being a positive voltage, the switch S3 connects to the second switch position (node 75) and the negative sense current $I_{SNS\_neg}$ is coupled to the output node directly as the monitor current output signal.

In the above-described embodiments, current sensing of the low-side power FET during channel conduction is described. During channel conduction, the power FET is enhanced or is turned on so that the current flow through a channel region of the power FET. Both positive current and negative current flows through the channel region of the power FET in the channel conduction mode. In some applications, the power FET may be operated in a body diode conduction mode where the power FET is not turned on and current is directed to flow through the power FET's body diode instead. Body diode conduction is also referred to as body braking which is used to increase the voltage across the inductor and speed up the ramp down of the inductor current, such as when a load release occurs. During body braking, the inductor current value may be very high and the high inductor current is being ramped down quickly to a low current value. The output voltage and current may experience large overshoots, until the inductor current has decreased sufficiently and the current can be regulated again. In the body diode conduction mode, the power switches typically cannot report the body diode current. Instead, conventional current monitoring schemes may offer some kind of emulation of the expected body diode current. For example, current monitoring can use estimates for the expected current ramp rate and project that forwards with no link to actual current condition. In one example, a design might assume an inductance and diode forward voltage and use an assumed/measured output voltage $V_{OUT}$ level to predict a ramp rate of $dI/dt=(V_{OUT}+0.7V)/L$. The conventional current monitoring schemes do not provide sense data based on the actual current value during the body diode conduction period.

According to another aspect of the present invention, a current monitoring scheme for a power FET configured as a low-side power switch in a power stage enables measuring or sensing of the body diode current flowing in the low-side power-FET when the low-side power FET is being operated in the body conduction mode. In some embodiments, the current monitoring scheme uses a smaller size sense FET for sensing the positive current as well as the body diode current flowing in the low-side power FET. A gain circuit is incorporated to adjust the gain of the sense current so that the channel current sensing and the body diode sensing are scaled to the same gain level to be provided as the monitor current output signal.

Figure 9:
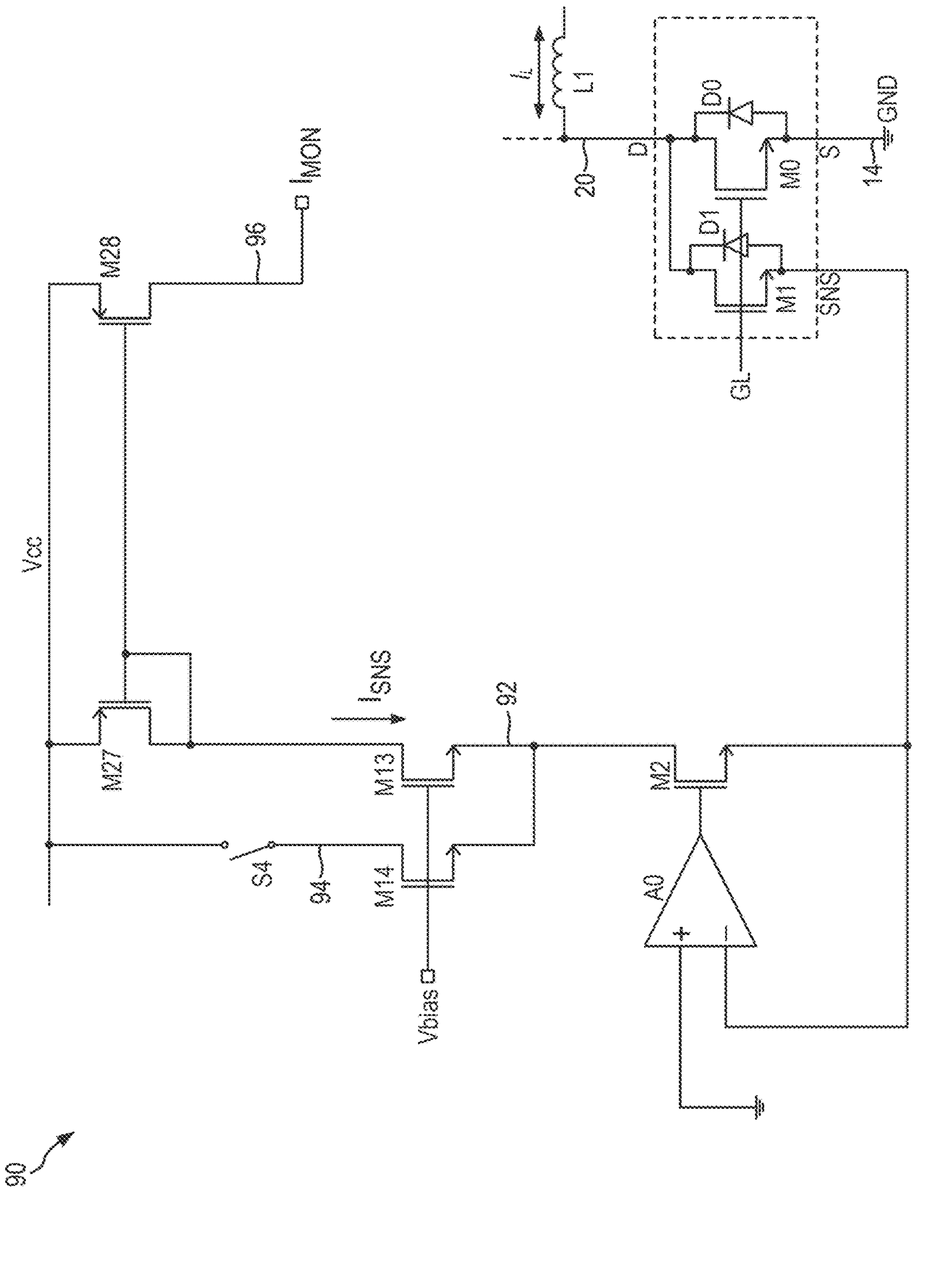
FIG. 9 is a circuit diagram of a current monitoring circuit coupled to a low-side power FET to implement current sensing for channel conduction and for body conduction in embodiments of the present invention.

FIG. 9 is a circuit diagram of a current monitoring circuit coupled to a low-side power FET to implement current sensing for channel conduction and for body conduction in embodiments of the present invention. Referring to FIG. 9, a current monitoring circuit 90 includes a sense FET M1 coupled to sense a current flowing in a low-side power FET M0. Similar to FIG. 3, the low-side power FET M0 is part of a power stage. The power stage may include a high-side circuit coupled together with the low-side power FET M0. The high-side circuit can be a diode (such as to realize an asynchronous buck converter) or the high-side circuit can be a power switch (such as to realize a synchronous buck converter). The exact implementation of the high-side circuit is not critical to the practice of the present invention. In some embodiments, the power stage is configured in the manner as shown in FIG. 1 and includes a high-side power FET MH0 coupled in series with the low-side power FET M0. In other embodiments, the power stage can be configured with other circuit elements for the high-side circuit. In the illustration shown in FIG. 9, the high-side circuit is omitted for simplicity. The common node 20 between the high-side circuit and the low-side power switch M0 is the switching node 20 which is to be coupled to the inductor of the LC filter circuit providing an output voltage to an output node, as shown in FIG. 1. The LC filter circuit is also omitted in the present illustration for simplicity.

The current monitoring circuit 90 includes a current sense circuit for sensing both the positive current and the body diode current flowing in the low-side power FET M0. In particular, the positive current flows in the channel region of the low-side power FET M0 while the body diode current flows in the body diode D0 of the low-side power FET M0. As described above, during the positive current mode, the drain voltage of the low-side power FET has negative voltage values. During the body diode conduction mode, the drain voltage of the low-side power FET is the body diode's forward voltage, which is −0.7V. The sense FET M1, by virtue of having the same drain and gate voltage across it, conducts a portion of the positive current in the channel region of the sense FET M1 or conducts a portion of the body diode current in the body diode D1 associated with the sense FET M1.

The current sense circuit includes an amplifier A0 and a FET M2 configured in a negative feedback loop, with the gate terminal of FET M2 being driven by the output signal of amplifier A0. In the present embodiment, FET M2 is an NMOS transistor. Amplifier A0 receives a ground voltage or 0V at the positive input terminal as the reference voltage. The source terminal of FET M2 and the negative input terminal of amplifier A0 are connected together and connected to the sense node SNS. As thus configured, the sense node SNS is regulated to the reference voltage of 0V by the feedback loop of amplifier A0 and FET M2. The current flowing in FET M2 is a sense current $I_{SNS}$.

The current monitoring circuit 90 further includes a gain circuit for selectively adjusting the gain level of the sense current $I_{SNS}$. In particular, the ratio between the channel current in the low-side power FET and the channel current in the sense FET while the FETs are turned on is different to the ratio of the body current in the low-side power FET to the body current of the sense FET when the FETs are off and the body diode is conducting. Accordingly, an additional gain term is introduced to maintain a constant gain for the monitor current output signal. In other words, a gain term is applied to keep the ratio of the sense current $I_{SNS}$ to the inductor current $I_L$ approximately equal for channel conduction and for body diode conduction.

In the present embodiment, the gain circuit includes a FET M13 and a FET M14. FET M13 is an NMOS transistor coupled between the drain terminal of FET M2 and a current mirror. FET M13 conducts the sense current ISNS sensed by the FET M2 in order to regulate the sense node to the ground voltage. FET M14 is another NMOS transistor having its source terminal coupled to the drain terminal of FET M2 and having its drain terminal connected by switch S4 to the positive power supply voltage Vcc. The FETs M13 and M14 have their gate terminals driven by a bias voltage Vbias. Voltage Vbias is selected to bias the FETs M13 and M14 with sufficient voltage headroom relative to the positive power supply voltage Vcc and ground voltage.

As thus configured, in the case switch S4 is open, the sense current $I_{SNS}$ flows through FET M13 only and is mirrored by the current mirror of PMOS transistors M27 and M28 to be provided to the output node 96 as the monitor current output signal $I_{MON}$. On the other hand, in the case switch S4 is closed, FET M14 shares a part of the current from FET M2 with FET M13. The remaining current in FET M13 is mirrored by the current mirror of PMOS transistors M27 and M28 to be provided to the output node 96 as the monitor current output signal $I_{MON}$. In the present embodiment, the monitor current output signal IMON has a positive current value when the current through the low-side power FET is a positive channel current or is a body diode current.

The switch S4 can be controlled by the host system as the host system knows when the low-side power FET will be operated in the channel conduction mode or the body diode conduction mode. In some embodiments, the current sense signal for body diode conduction has a larger gain than that of the current sense signal during channel conduction mode. Therefore, when the low-side power FET is operated in the channel conduction mode, the switch S4 may be open and FET M14 is not engaged in the sense current path of the current monitoring circuit. The gain of the current sense signal for the channel conduction mode is therefore a function of the entire current of the sense current path (the current from FET M2). Meanwhile, when the low-side power FET is operated in the body diode conduction mode, the switch S4 may be closed and FET M14 diverts a certain amount of current from the sense current path (FET M2) of the current monitoring circuit. The gain of the current sense signal is therefore decreased for the body diode conduction mode. In this manner, the gain level of the current sense signal is individually adjusted as a function of the conduction modes of the low-side power switch. The channel current sensing and the body diode sensing are thereby scaled to the same gain level to be provided as the monitor current output signal.

In other embodiments, the current sense signal for channel conduction may have a larger gain than that of the current sense signal during body diode conduction mode. In that case, the logical control for switch S4 may be reversed. That is, the switch S4 is open and the gain of the current sense signal is larger in the case the low-side power FET is operated in the body diode conduction mode. Meanwhile, the switch S4 is closed and the gain of the current sense signal is decreased in the case the low-side power FET is operated in the channel conduction mode. In this manner, the channel current sensing and the body diode sensing are scaled to the same gain level to be provided as the monitor current output signal. It is instructive to note that the logical behavior of switch S4 is not critical to the practice of the present invention. In implementations, the switch S4 may be open to increase the gain to the current sense signal and the switch S4 may be closed to decrease the gain of the current sense signal and the host system may configure the control of switch S4 depending on the characteristics of the current sense signal for different conduction modes.

In the embodiment shown in FIG. 9, the current monitoring circuit 90 includes sense circuitry for measuring the positive current and the body diode current of the low-side power FET M0. In other embodiments, the current monitoring circuit 90 may further include sense circuitry for measuring the negative current in the low-side power FET M0, as shown in FIG. 6 and described above.

Figure 10:
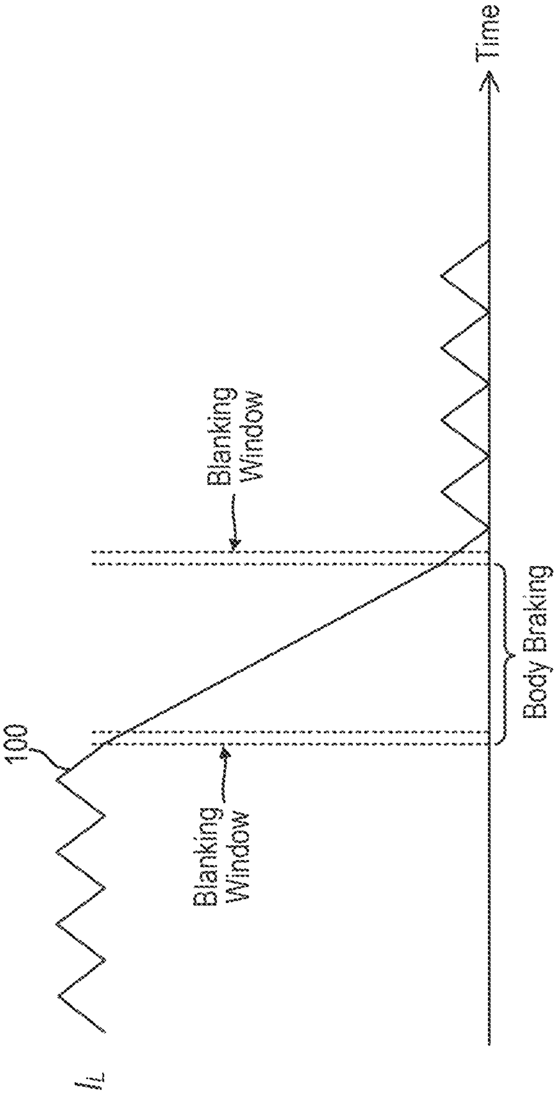
FIG. 10 is a plot illustrating the behavior of the inductor current during body braking operation in some examples.

FIG. 10 is a plot illustrating the behavior of the inductor current employing body braking operation in some examples. At a given point in time, the inductor current $I_L$ (curve 100) may be at a high current value, such as for supplying a heavy load. Then changes in the load conduction may result in less inductor current being demanded. The control circuit, such as the switching regulator control circuit, may control the power stage to operate in the body braking mode to quickly ramp down the inductor current from the high level to the low level. For example, the low-side power switch and the high-side power switch may be turned off. Referring to FIG. 10, the power stage is initially operating in the channel conduction mode to provide an inductor current $I_L$ (curve 100) at a high current level. Changes in load conditions reduce the current demand and the power stage operates the low-side power switch in the body diode conduction mode (or body braking mode), such as by turning off the low-side power switch, to decrease the inductor current rapidly, as shown in FIG. 10. Once the inductor current is reduced sufficiently, the power stage can again control the low-side power switch together with the high-side circuit to regulate the output voltage.

During the body braking period, it is still desirable for the current monitoring circuit to report on the actual measurement of the diode current value, instead of using emulated or predicted current values. In embodiments of the present invention, the current monitoring circuit is capable of measuring the body diode current during the body conduction period to provide a monitor current output signal that reflects the actual current value of the body diode current flowing in the low-side power FET.

In embodiments of the present invention, the current monitoring circuit may apply blanking of the monitor current output signal on entry into the body diode conduction mode and on exit out of the body diode conduction mode to avoid large current overshoots and to allow the sense current value to be stabilized before being reported to the output signal. In some embodiments, during the transition period when the low-side power FET transitions into the body diode conduction mode or transition into the channel conduction mode, the current monitoring circuit applies blanking to the monitor current output signal. The monitor current output signal may hold the last current value before blanking and jump to the new current value after the blanking period has expired. For example, FIG. 10 illustrates two blanking windows where the measurement of the inductor current maybe blanked. The first blanking window is applied when the inductor current transitions into the body braking mode for body diode conduction and the second blanking window is applied when the inductor current transitions out of the body diode conduction mode and enters into the channel conduction mode.

In some embodiments, a switched capacitor circuit may be used to apply the blanking of the monitor current output signal. Referring to FIG. 7, in the active mirror circuit 60, capacitor C1 and switch S1 operate to apply blanking of the positive current sense signal. When switch S1 is closed, the voltage across resistors R1 and R2 sets the capacitor voltage (with a low time constant) and the sense current is mirrored to the output node 70 as the monitor current output signal $I_{MON}$. When the switch S1 is open, the capacitor C1 holds the last known voltage, with no link to the sense current inputs. Thus the monitor current output signal $I_{MON}$ is blanked until switch S1 is closed again. The switched capacitor circuit of C2 and S2 in the active mirror circuit 65 operates in the same way to blank the negative current sense signal.

In this detailed description, process steps described for one embodiment may be used in a different embodiment, even if the process steps are not expressly described in the different embodiment. When reference is made herein to a method including two or more defined steps, the defined steps can be carried out in any order or simultaneously, except where the context dictates or specific instruction otherwise are provided herein. Further, unless the context dictates or express instructions otherwise are provided, the method can also include one or more other steps carried out before any of the defined steps, between two of the defined steps, or after all the defined steps.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A current monitoring circuit coupled to sense a current in a power field effect transistor (FET) configured as a low-side power FET in a power stage, a drain terminal of the low-side power FET being a switching output node, the current monitoring circuit comprising:

a sense field effect transistor (FET) having a drain terminal connected to the drain terminal of the low-side power FET, a gate terminal connected to a gate terminal of the low-side power FET, and a source terminal being a sense node, the sense FET conducting a current indicative of the current flowing through the low-side power FET including a channel current flowing through a channel region of the low-side power FET and a body diode current flowing through a body diode of the low-side power FET;

a current sense circuit coupled to the sense node to bias the sense node to a first voltage being a voltage at the source terminal of the low-side power FET, the current sense circuit sensing a first sense current flowing in the sense FET; and a gain circuit coupled to the current sense circuit to selectively adjust a gain level of the first sense current, wherein the first sense current has a first gain level in response to sensing the channel current of the low-side power FET and the first sense current has a second gain level in response to sensing the body diode current of the low-side power FET; and wherein the gain circuit adjusts the first or second gain level of the first sense current to scale the first and second gain levels to a same gain level to provide a current output signal indicative of the channel current or the body diode current flowing through the low-side power FET; and wherein the gain circuit is engaged to reduce the gain level of the first sense current and the gain circuit is disengaged to leave the gain level of the first sense current unmodified.

2. The current monitoring circuit of claim 1, wherein:

in response to the low-side power FET being biased at the gate terminal to be in an on state, the gain circuit is disengaged and the current sense circuit provides the first sense current having the first gain level as the current output signal indicative of the channel current flowing through the channel region of the low-side power FET to the switching output node; and in response to the low-side power FET being biased at the gate terminal to be in an off state and the low-side power FET conducting current through the body diode of the low-side power FET, the gain circuit adjusts the second gain level of the first sense current to provide a gain-adjusted sense current as the current output signal indicative of the body diode current flowing through the low-side power FET.

3. The current monitoring circuit of claim 2, wherein the first gain level is less than the second gain level and the gain circuit adjusts the second gain level by reducing a value of the second gain level.

4. The current monitoring circuit of claim 1, wherein:

in response to the low-side power FET being biased at the gate terminal to be in an on state, the gain circuit adjusts the first gain level of the first sense current to provide a gain-adjusted sense current as the current output signal indicative of the channel current flowing through the channel region of the low-side power FET to the switching output node; and in response to the low-side power FET being biased at the gate terminal to be in an off state and the low-side power FET conducting current through the body diode of the low-side power FET, the gain circuit is disengaged and the current sense circuit provides the first sense current having the second gain level as the current output signal indicative of the body diode current flowing through the low-side power FET.

5. The current monitoring circuit of claim 4, wherein the first gain level is greater than the second gain level and the gain circuit adjusts the first gain level by reducing a value of the first gain level.

6. The current monitoring circuit of claim 1, wherein the current sense circuit biases the sense node to the first voltage being a ground voltage.

7. The current monitoring circuit of claim 1, wherein the current monitoring circuit further comprises:

a negative current sense circuit coupled to the sense node to bias the sense node to a second voltage being greater than a drain-to-source voltage of the low-side power FET, the negative current sense circuit sensing a second sense current flowing in the sense FET indicative of a negative current flowing from the switching output node into the low-side power FET; and a sense current combining circuit coupled to receive the first sense current and the second sense current to provide the current output signal indicative of the positive current, the negative current and the body current flowing through the low-side power FET.

8. The current monitoring circuit of claim 6, wherein the current sense circuit comprises:

a first amplifier having a positive input terminal coupled to the ground voltage, a negative input terminal coupled to the sense node, and an output terminal; and a first FET having a gate terminal coupled to the output terminal of the first amplifier, a source terminal coupled to the negative input terminal of the first amplifier and to the sense node and providing the first sense current, and a drain terminal coupled to a current sourcing circuit.

9. The current monitoring circuit of claim 8, wherein the gain circuit comprises:

a second FET having a gate terminal coupled to a bias voltage, a source terminal coupled to the drain terminal of the first FET, and a drain terminal coupled to a current mirroring circuit, wherein the current mirror circuit provides the current output signal indicative of the first sense current; and a third FET having a gate terminal coupled to the bias voltage, a source terminal coupled to the drain terminal of the first FET, and a drain terminal coupled to a switch, wherein the switch is coupled between the drain terminal of the third FET and a first power supply voltage, wherein the third FET is selectively engaged by the switch to adjust the gain level of the first sense current.

10. The current monitoring circuit of claim 9, wherein the first, second and third FETs comprise N-type field effect transistors and the current mirroring circuit comprises P-type field effect transistors.

11. The current monitoring circuit of claim 9, wherein the current mirroring circuit comprises P-type field effect transistors coupled to the first power supply voltage, the first power supply voltage comprising a positive power supply voltage.

12. The current monitoring circuit of claim 1, wherein the first sense current flowing in the sense FET and the channel current flowing from the low-side power FET has a first gain ratio; and the first sense current flowing in the sense FET and the body diode current flowing through the low-side power FET has a second gain ratio, the first ratio being different the second ratio, and wherein the gain circuit adjusts the gain level of the first sense current to compensate for the difference in the first gain ratio and the second gain ratio.

13. The current monitoring circuit of claim 12, wherein the gain circuit adjusts the gain level of the first sense current to keep a ratio of the first sense current to the current flowing in the low-side power FET constant for the case the channel current is flowing in the channel region of the low-side power FET and the case the body diode current is flowing in the low-side power FET.

14. The current monitoring circuit of claim 1, further comprising:

a blanking circuit to mask the first sense current during a transition period when the low-side power FET is switching to or switching from a body diode conduction mode.

15. The current monitoring circuit of claim 14, wherein the blanking circuit comprises a switched capacitor circuit selectively connected to hold the first sense current value during the transition period.

16. The current monitoring circuit of claim 9, wherein the current mirroring circuit comprises an active current mirror, the active current mirror comprises an amplifier and a field effect transistor configured in a negative feedback configuration to provide the current output signal at an output node.

17. The current monitoring circuit of claim 1, wherein the power stage includes a high-side power FET connected in series with the low-side power FET, a common node between the high-side power FET and the low-side power FET being the switching output node.

* * * * *